(12) United States Patent
Kaiser et al.

(10) Patent No.: US 8,524,573 B2
(45) Date of Patent: Sep. 3, 2013

(54) METHOD FOR SEPARATING A SEMICONDUCTOR LAYER FROM A SUBSTRATE BY IRRADIATING WITH LASER PULSES

(75) Inventors: Stephan Kaiser, Regensgurg (DE); Volker Härle, Laaber (DE); Berthold Hahn, Hemau (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 2169 days.

(21) Appl. No.: 10/544,306

(22) PCT Filed: Jan. 27, 2004

(86) PCT No.: PCT/DE2004/000123
§ 371 (c)(1),
(2), (4) Date: May 30, 2006

(87) PCT Pub. No.: WO2004/068572
PCT Pub. Date: Aug. 12, 2004

(65) Prior Publication Data
US 2006/0246687 A1 Nov. 2, 2006

(30) Foreign Application Priority Data
Jan. 31, 2003 (DE) .................................. 103 03 977

(51) Int. Cl.
*H01L 21/428* (2006.01)

(52) U.S. Cl.
USPC ................... 438/458; 257/E21.6; 219/121.85

(58) Field of Classification Search
USPC ...................................................... 257/E21.6
See application file for complete search history.

(56) References Cited

U.S. PATENT DOCUMENTS

| | | | |
|---|---|---|---|
| 4,159,214 A | 6/1979 | Mason |
| 4,749,840 A | 6/1988 | Piwczyk |
| 5,196,354 A | 3/1993 | Ohtaka et al. |
| 5,300,756 A | 4/1994 | Cordingley |
| 5,326,424 A | 7/1994 | Doll et al. |
| 5,625,202 A | 4/1997 | Chai |
| 5,670,798 A | 9/1997 | Schetzina |
| 5,674,758 A | 10/1997 | McCarthy |
| 5,838,870 A | 11/1998 | Soref |

(Continued)

FOREIGN PATENT DOCUMENTS

| | | |
|---|---|---|
| CN | 1200560 | 12/1998 |
| CN | 1318206 | 10/2001 |

(Continued)

OTHER PUBLICATIONS

Wong et al., "INxGa1-XN Light Emitting Diodes on Si Substrates Fabricated by Pd—In Metal Bonding and Laser Lift-Off", Applied Physics Letters, American Institute of Physics, vol. 77, No. 18, pp. 2822-2824, Oct. 30, 2000.

(Continued)

*Primary Examiner* — Stephen W Smoot
(74) *Attorney, Agent, or Firm* — Cozen O'Connor (57) ABSTRACT

A method for producing a semiconductor component, in which a semiconductor layer is separated from a substrate by irradiation with laser pulses, the pulse duration of the laser pulses being less than or equal to 10 ns. The laser pulses have a spatial beam profile with a flank slope is chosen to be gentle enough to prevent cracks in the semiconductor layer that arise as a result of thermally induced lateral stresses during the separation of semiconductor layer and substrate.

1 Claim, 5 Drawing Sheets

(56) References Cited

U.S. PATENT DOCUMENTS

| | | |
|---|---|---|
| 5,998,291 A | 12/1999 | Bakhit et al. |
| 6,071,795 A | 6/2000 | Cheung et al. |
| 6,111,276 A | 8/2000 | Mauk |
| 6,135,645 A | 10/2000 | Grotsch |
| 6,136,141 A | 10/2000 | Glatfelter et al. |
| 6,169,298 B1 | 1/2001 | Lin et al. |
| 6,181,855 B1 | 1/2001 | Richter et al. |
| 6,280,523 B1 | 8/2001 | Coman et al. |
| 6,287,882 B1 | 9/2001 | Chang et al. |
| 6,300,224 B1 | 10/2001 | Arima et al. |
| 6,331,208 B1 | 12/2001 | Nishida et al. |
| 6,365,429 B1 | 4/2002 | Kneissl et al. |
| 6,372,608 B1 | 4/2002 | Shimoda et al. |
| 6,380,097 B1 | 4/2002 | Dauplaise et al. |
| 6,504,180 B1 | 1/2003 | Heremans et al. |
| 6,559,075 B1 | 5/2003 | Kelly et al. |
| 6,562,648 B1 | 5/2003 | Wong et al. |
| 6,740,604 B2 | 5/2004 | Kelly et al. |
| 6,814,832 B2 | 11/2004 | Utsunomiya |
| 6,902,098 B2 | 6/2005 | Dautartas |
| 6,958,093 B2 | 10/2005 | Vaudo et al. |
| 2002/0102830 A1 | 8/2002 | Ishida |
| 2002/0137248 A1 | 9/2002 | Ogawa et al. |
| 2002/0170488 A1 | 11/2002 | Yuri |
| 2002/0182839 A1 | 12/2002 | Ogawa et al. |
| 2003/0190794 A1 | 10/2003 | Ohmi et al. |
| 2006/0220042 A1 | 10/2006 | Yaegashi et al. |
| 2007/0228395 A1 | 10/2007 | Kamiyama et al. |

FOREIGN PATENT DOCUMENTS

| | | |
|---|---|---|
| DE | 43 24 318 C1 | 1/1995 |
| DE | 195 46 443 A1 | 6/1997 |
| DE | 196 40 594 A1 | 4/1998 |
| DE | 197 06 279 A1 | 8/1998 |
| DE | 198 21 544 A1 | 12/1999 |
| DE | 100 56 645 A1 | 9/2001 |
| DE | 102 03 795 A1 | 8/2003 |
| DE | 103 03 978 A1 | 11/2003 |
| EP | 0 247 331 A2 | 4/1987 |
| EP | 0 553 860 A2 | 1/1993 |
| EP | 0 867 919 A2 | 3/1998 |
| JP | 55165639 A | 12/1980 |
| JP | 3-102876 | 4/1991 |
| JP | 7273401 | 10/1995 |
| JP | 10326884 | 12/1998 |
| JP | 2000174350 | 6/2000 |
| JP | 2000-196197 | 7/2000 |
| JP | 2001015798 | 1/2001 |
| JP | 2001-501778 | 2/2001 |
| JP | 2001-244503 | 9/2001 |
| JP | 2002-338398 A | 11/2002 |
| JP | 2002-343717 A | 11/2002 |
| JP | 2003-7616 A | 1/2003 |
| KR | 10 2000-076604 | 12/2000 |
| KR | 10 2004-067283 | 7/2004 |
| KR | 10 2005-013989 | 2/2005 |
| TW | 409295 | 10/2000 |
| WO | WO 95/03628 | 2/1995 |
| WO | WO 98/14986 A | 4/1998 |
| WO | WO 03/065420 A2 | 8/2003 |

OTHER PUBLICATIONS

Wong et al., "Structural and Optical Quality of GaN/Metal/ Si Heterostructures Fabricated by Excimer Laser Lift-Off", Applied Physics Letters, American Institute of Physics, New York, vol. 75, No. 13, Sep. 1999, pp. 1887-1889.

Toet et al., "Thin-Film Transistors Fabricated in Printed Silicon" Japanese Journal of Applied Physics, vol. 38, Part 2, No. 10A, pp. L1149-L1152 Oct. 1999.

Angelis, et al., "Electrical and Noise Properties of Thin-Film Transistors on Very Thin Excimer Laser Annealed Polycrystalline Silicone Films", Applied Physics American Institute of Physics, New York, Bd. 74, Nr. 24, pp. 3684-3686, 1999.

L. Maricuui et al., "Latera growth control in excimer laser crystallized polysilicon", Thin Solid Films, vol. 337, pp. 137-142, 1999.

C.T. Angelis, et al., "Effect of excimer laser annealing on the structural and electrical properties of polycrystalline silicon thin-film transistors", Journal of Applied Physics, vol. 86, No. 8, pp. 4600-4606, Oct. 1999.

Yong-Feng Lu et al., "Excimer-Laser Removal of $SiO_2$ Patterns from GaAs Substrates", Jpn. Journal of Applied Physics, vol. 33, No. 3A, Part 2, pp. L324-L327, Mar. 1, 1994.

M.K. Kelly, et al., "Optical patterning of GaN films", Applied Physics Letters ISSN 0003-6951, vol. 69, No. 12, pp. 1749-1751, 1996.

Laser Beam Homogenizer, Laser-Laboratorium Gottingen e.v., Technisches Datenblatt, 1995.

I. Schnitzer et al., "30% external quantum efficiency from surface textured, thin-film-light-emitting diodes", Appl. Phys. Lett. vol. 63, No. 16, pp. 2174-2176, Oct. 1993.

C.R. Huggings, et al., "Ultrathin GaAs Solar Cells using Germanium Substrates", Proceedings of the photovoltaic specialists conference, pp. 318-322, Oct. 7-11, 1991.

METHOD FOR SEPARATING A
SEMICONDUCTOR LAYER FROM A
SUBSTRATE BY IRRADIATING WITH LASER
PULSES

RELATED APPLICATIONS

This is a U.S. national stage of application No. PCT/DE2004/000123, filed on 27 Jan. 2004.

This patent application claims the priority of German patent application no. 103 03 977.5, filed 31 Jan. 2003, the disclosure content of which is hereby incorporated by reference.

FIELD OF THE INVENTION

The present invention relates to a method for producing a semiconductor component, in which a semiconductor layer is separated from a substrate by irradiation with a laser beam.

BACKGROUND OF THE INVENTION

A method of this type is used for example in the production of substrateless luminescence diodes based on GaN. Such components contain a semiconductor body and a carrier part, on which the semiconductor body is fixed. In order to produce the semiconductor body, firstly a semiconductor layer is fabricated on a suitable substrate, subsequently connected to a carrier and then stripped away from the substrate. Dividing up, for example sawing up, the carrier with the semiconductor layer arranged thereon produces a plurality of semiconductor bodies which are in each case fixed on the corresponding carrier part. What is essential in this case is that the substrate used for producing the semiconductor layer is removed from the semiconductor layer and does not simultaneously serve as a carrier or carrier part in the component.

This production method has the advantage that different materials are used for the substrate and the carrier. The respective materials can thus be adapted, largely independently of one another, to the various requirements for the production of the semiconductor layer, on the one hand, and the operating conditions, on the other hand. Thus, the carrier can be chosen in accordance with its mechanical, thermal and optical properties independently of the requirements made of the substrate for the fabrication of the semiconductor layer.

The epitaxial production of a semiconductor layer, in particular, makes numerous special requirements of the epitaxial substrate. By way of example, the lattice constants of the substrate and of the semiconductor layer to be applied have to be adapted to one another. Furthermore, the substrate should withstand the epitaxy conditions, in particular temperatures of up to in excess of 1000° C., and be suitable for the epitaxial accretion and growth of an as far as possible homogeneous layer of the relevant semiconductor material.

By contrast, other properties of the carrier, such as, by way of example, electrical and thermal conductivity and also radiation transmissivity in the case of opto-electronic components, come to the fore for the further processing of the semiconductor body and operation. Therefore, the materials suitable for an epitaxial substrate are often only suitable to a limited extent as carrier part in the component. Finally, it is desirable, particularly in the case of comparatively expensive epitaxial substrates such as silicon carbide substrates, for example, to be able to use the substrates repeatedly.

The stripping-away of the semiconductor layer from the substrate is essential for the aforementioned production method. Said stripping-away can be achieved by irradiating the semiconductor-substrate interface with laser radiation. In this case, the laser radiation is absorbed in the vicinity of the interface, where it effects decomposition of the semiconductor material.

The semiconductor layer may be separated from the substrate for example by means of laser stripping, as described in U.S. Pat. No. 6,740,604. In this case, the frequency-tripled radiation of a Q-switch Nd:YAG (Yttrium Aluminum Garnet) laser having a pulse duration of between 1 ns and 10 ns and a wavelength of 355 nm is used for stripping GaN and GaInN layers from a sapphire substrate. The sapphire substrate is transparent to radiation at this wavelength. The radiation energy is absorbed in a boundary layer having a thickness of approximately 50 nm to 300 nm at the junction between the sapphire substrate and the GaN semiconductor layer. At pulse energies above 200 mJ/cm$^2$, temperatures of more than 850° C. are reached at the interface. The GaN boundary layer decomposes at this temperature to liberate nitrogen, and the bond between the semiconductor layer and the substrate is separated.

Generally, a mechanical stabilization of the semiconductor layer to be stripped away is necessary since the layer thickness is so small that otherwise there is the risk of damage, in particular a break or crack in the layer. For this purpose, the semiconductor layer may be connected to a suitable carrier. Such a connection should be thermostable, at least to an extent such that it withstands without damage the temperatures that occur during subsequent fabrication steps. Furthermore, said connection should also remain stable in the event of alternating temperature loads which may occur, in particular, during operation of the component.

It has been shown that the individual laser parameters are of crucial importance for the result of the stripping process in this case. In particular, the laser parameters have to be coordinated with one another such that, on the one hand, the semiconductor layer is stripped as far as possible completely and in a manner free of residues, but on the other hand the connection to the carrier mentioned is not impaired.

SUMMARY OF THE INVENTION

One object of the present invention is to provide an improved method for producing a semiconductor component in which a semiconductor layer is separated from a substrate by means of laser irradiation.

This and other objects are attained in accordance with one aspect of the present invention directed to a method for producing a semiconductor component, in which a semiconductor layer is separated from a substrate by irradiation with laser pulses, the pulse duration of the laser pulses being less than or equal to 10 ns. The laser pulses have a spatial beam profile with a flank slope gentle enough to prevent cracks in the semiconductor layer that arise as a result of thermally induced lateral stresses, during the separation of semiconductor layer and substrate.

The invention is based on the realization that for stripping away the semiconductor layer from the substrate as far as possible completely and in a manner free of residues with a given energy for the decomposition of the semiconductor material, in particular the pulse duration and the beam profile are to be coordinated with one another. The pulse duration is to be chosen such that the temperature required for the thermal decomposition of the semiconductor layer at the interface with the substrate is momentarily attained. It must be taken into account in this case, however, that the total input of energy into the semiconductor layer and the associated increase in temperature of the semiconductor layer overall are to be kept low enough that the connection to the carrier is not impaired. In particular, melting of a soldering connection between carrier and semiconductor layer is to be avoided since otherwise there is the risk of the carrier rather than, as desired, the substrate being detached from the semiconductor layer during the stripping process.

It has been shown in the context of the invention that a pulse duration of less than or equal to 10 ns is advantageous. In particular, experiments have shown that in the case of pulse durations of greater than 10 ns, e.g. at 15 ns, a soldering connection between carrier and semiconductor layer may already partially melt.

It was furthermore realized in the context of the invention that a spatially Gaussian beam profile is advantageous in the case of a separation by means of laser pulses having a pulse duration of less than or equal to 10 ns. During irradiation with laser pulses, in each case between the irradiated region within the laser pulse and the non-irradiated surroundings, a temperature difference arises in the semiconductor layer, which leads to mechanical stresses on account of the correspondingly different thermal expansion in the lateral direction. As the flank slope of the spatial beam profile rises, the thermal gradient also increases and ultimately so does the risk of the mechanical stresses causing cracks in the semiconductor layer. A Gaussian spatial beam profile has proved advantageous here, in which case the flank slope is to be chosen so as to avoid cracks in the semiconductor layer. A Lorentz profile, a hypergaussian profile with a corresponding flank slope in each case, or more widely a profile with Gaussian-like, Lorentz-like or hypergaussian-like flanks could also be used as the beam profile.

The invention provides for separating a semiconductor layer from a substrate by irradiation with laser pulses whose pulse duration is less than or equal to 10 ns, the laser pulses having a spatial beam profile, preferably a Gaussian-like beam profile, whose flank slope is chosen to be gentle enough to prevent cracks in the semiconductor layer that arise as a result of thermally induced lateral stresses, during the separation of semiconductor layer and substrate.

The laser pulses can be generated by a solid-state laser with an Nd-doped laser-active medium, in particular Nd:YAG or else Nd:YLF or Nd:PGT (YLF:Yttrium Lithium Fluoride; PGT: Potassium Gadolinium Tungstenate). The main emission wavelength is approximately 1060 nm (e.g. 1064 nm for Nd:YAG), so that it is possible to achieve a wavelength—advantageous for the stripping-away—in the ultraviolet spectral range through frequency tripling by means of a nonlinear optical element. The wavelength of the laser pulses used for the separation preferably lies between 200 nm and 400 nm, particularly preferably between 300 nm and 400 nm.

As an alternative, the laser pulses may also be generated by means of an excimer laser. In particular excimer lasers with a noble gas-halogen compound as laser medium are distinguished by an advantageous emission wavelength in the ultraviolet spectral range and a high pulse peak power typically lying between 1 kW and 100 MW.

Since excimer lasers generally rather have a rectangular beam profile with steep flanks, it is necessary to provide a corresponding beam shaper which converts the beam profile into a spatial beam profile with sufficiently shallow flanks, preferably a Gaussian beam profile.

In the case of semiconductor layers with a relatively large lateral extent, it is advantageous for individual regions of the semiconductor layer that are arranged next to one another to be irradiated successively, in order to avoid an excessively large expansion of the beam area. In this case, it is expedient to guide the laser beam and/or the substrate with the semiconductor layer situated thereon such that the irradiated individual regions produce an area-filling overall arrangement.

In the case of the invention, it is preferred to irradiate the direct interface region between semiconductor layer and substrate with the laser pulses, so that the radiation energy is absorbed near the interface and leads to a material decomposition there. This may be achieved by virtue of the fact that the substrate is transmissive to the laser radiation and the semiconductor layer is irradiated through the substrate. In the case of this arrangement, the absorption of the laser radiation is generally significantly greater in the semiconductor layer than in the substrate, so that the laser beam penetrates through the substrate virtually without any losses and is absorbed on account of the high absorption near the interface in the semiconductor layer.

It should be noted that the radiation absorption need not necessarily be effected at the location of material decomposition. The material decomposition may also be effected by the radiation firstly being absorbed at a different location and then the absorbed radiation energy being transported to the location of material decomposition. If appropriate, the radiation could also be absorbed in the substrate and the radiation energy could subsequently be transported to the semiconductor layer.

The semiconductor layer can be patterned prior to separation from the substrate in such a way that the semiconductor layer is divided into a plurality of individual semiconductor bodies. By way of example, it is possible for this purpose to form trench-type depressions in the semiconductor layer which laterally enclose the semiconductor bodies to be formed and, in terms of depth, preferably extend as far as the substrate. Such depressions may be produced for example by means of a suitable etching method. By means of this so-called "chip patterning", the semiconductor layer is advantageously interrupted at least partially in the lateral direction. It is thus possible to reduce mechanical stresses in the semiconductor layer.

The semiconductor layer or the semiconductor bodies are preferably subsequently provided with a passivation layer. Said passivation layer protects the side areas of the semiconductor bodies that have been uncovered as a result of the patterning. An electrically nonconductive passivation layer is advantageous in this case in order to avoid a short circuit of the semiconductor layer by electrically conductive material which may reach the uncovered side areas of the semiconductor bodies during subsequent processing steps.

In a further aspect of the invention, it is provided that, prior to separation, the semiconductor layer is applied, preferably soldered, onto a carrier by the side remote from the substrate. A soldering connection is distinguished by a high thermal and electrical conductivity in comparison with conventional adhesive connections.

The solder used is preferably a gold-containing solder, for example a gold-tin solder. Gold-tin solders having a high proportion of gold, for example between 65% by weight and 85% by weight, are particularly preferred in this case.

The melting point of such a solder is typically 278° C. and is thus greater than the temperature which usually arises during the soldering of an electrical component. Thus, by way of example, the soldering temperature in the course of soldering onto a printed circuit board is generally less than 260° C. This prevents the semiconductor body from being stripped away from the carrier part when the component is soldered.

Furthermore, an example of a suitable solder is a palladium-indium solder, the constituents of which are intermixed at a comparatively low initial temperature of approximately 200° C., and which has an advantageously high melting point of in excess of 660° C. after intermixing.

Such a connection may be produced for example by applying a gold layer on the semiconductor layer and a gold-tin layer on the carrier and then joining together the carrier and the semiconductor layer. In this case, it is possible to provide further layers between the semiconductor layer and the metal layer, said further layers ensuring for example protection of the semiconductor layer or good adhesion.

With regard to a low contact resistance and advantageous soldering properties, it is expedient to provide the semiconductor layer with a contact metallization on the side facing the carrier, prior to soldering onto the carrier. A platinum-gold metallization, for example, is suitable for this purpose.

In a further aspect of the invention, it is provided that the coefficient of thermal expansion of the carrier is chosen in a manner matched with the coefficient of thermal expansion of the semiconductor layer and/or the coefficient of thermal expansion of the substrate and also the pulse duration of the laser pulses.

Generally, a matching of the coefficients of thermal expansion is to be understood to mean that their difference is so small that, in the temperature range that occurs during production or is provided in operation, no damage is produced at the semiconductor layer and the carrier. In particular, this makes it possible to significantly reduce stresses between substrate, semiconductor layer and carrier during production. The risk of cracking in the carrier and in the semiconductor layer is thus greatly decreased.

Although the temperatures reached at the semiconductor surface decrease significantly over the layer thickness of the semiconductor layer, temperatures of approximately 200° C. to 400° C. are still reached at the carrier side of the semiconductor layer in the region of the laser pulse. Consequently, tensile stresses arise on account of the locally different temperatures within and outside the irradiated region both in the semiconductor layer and in the carrier on account of the generally different coefficients of thermal expansion of the semiconductor material and the carrier material, and may lead to the observed formation of cracks in the semiconductor material at the edges of the respectively irradiated region.

During the further processing of such semiconductor layers provided with cracks, the problem arises, for example, that acid can creep along the cracks under the semiconductor layer and, for instance, destroys a bonding metallization there.

In the case of the invention, use is preferably made of carrier materials whose thermal properties are specially adapted to the stripping process. In this case, it is advantageous to choose the carrier material such that the coefficient of thermal expansion of the carrier lies nearer to the coefficient of thermal expansion of the semiconductor layer than to the coefficient of thermal expansion of the substrate. Such a choice makes it possible to effectively reduce or completely avoid the formation of cracks in the semiconductor layer.

It should be noted that, in the case of the invention, the adaptation of the thermal properties of substrate, carrier and semiconductor layer is advantageous for stripping that is as far as possible complete and free of residues. However, the invention also has the advantage that, on account of the short pulse duration of less than or equal to 10 ns, the requirements made of this adaptation of the thermal properties are less stringent than in the case of conventional methods having a longer pulse duration. Consequently, the invention may serve, on the one hand, for achieving the best possible stripping. On the other hand, in the context of the invention, it is also advantageously possible to use carrier materials which are suitable with regard to their thermal properties, even though they are not optimal, but have other desirable properties such as, for example, facilitated processability for further process steps, easier availability in relatively large dimensions or lower costs.

The invention is suitable in particular for semiconductor layers containing a nitride compound semiconductor. Nitride compound semiconductor are for example nitride compounds of elements of the third and/or fifth main group of the periodic table, such as GaN, AlGaN, InGaN, AlInGaN, InN or AlN. In this case, the semiconductor layer may also comprise a plurality of individual layers of different nitride compound semiconductors. Thus, the semiconductor layer may have for example a conventional pn junction, a double heterostructure, a single quantum well structure (SQW structure) or a multiple quantum well structure (MQW structure). Such structures are known to the person skilled in the art and are therefore not explained in any greater detail at this point. Such structures are preferably used in optoelectronic components such as luminescence diodes, for example in the form of light emitting diodes (LEDs) or laser diodes.

For nitride compound semiconductors, carriers are suitable, for example, which contain gallium arsenide, silicon, germanium, copper, iron, nickel, molybdenum, cobalt or tungsten or an alloy, for example based on iron, nickel and/or cobalt.

Examples of a suitable substrate for the epitaxial production of nitride compound semiconductor layers are silicon, silicon carbide or aluminum oxide or sapphire substrates, sapphire substrates advantageously being transmissive to the laser radiation used for the separation of the semiconductor layer, in particular in the ultraviolet spectral range. This enables irradiation of the semiconductor through the substrate when stripping away the semiconductor layer.

The method according to the invention may advantageously be employed in the case of thin-film chips typically having a semiconductor layer with a thickness of less than approximately 50 μm. The thin-film chip may be for example an optoelectronic chip, in particular a radiation-generating chip such as a luminescence diode chip, for example.

A thin-film luminescence diode chip is distinguished in particular by at least one of the following characteristic features:
  a reflective layer is applied or formed at a first main area of a radiation-generating epitaxial layer sequence that faces toward a carrier element, which reflective layer reflects at least a part of the electromagnetic radiation generated in the epitaxial layer sequence back into the latter;
  a thin-film luminescence diode chip is to a good approximation a Lambert surface radiator;
  the epitaxial layer sequence has a thickness in the region of 20 μm or less, in particular in the region of 10 μm; and
  the epitaxial layer sequence contains at least one semiconductor layer with at least one area having an intermixing structure which ideally leads to an approximately ergodic distribution of the light in the epitaxial layer sequence, i.e. it has an as far as possible ergodically stochastic scattering behavior.

A basic principle of a thin-film luminescence diode chip is described for example in I. Schnitzer et al., Appl. Phys. Lett. 63 (16), Oct. 18, 1993, 2174-2176, the disclosure content of which is in this respect hereby incorporated by reference. It should be noted that although the present invention relates particularly to thin-film luminescence diode chips, it is not restricted thereto. Rather, the present invention is also suitable for all other thin-film semiconductor bodies besides thin-film luminescence diode chips.

DETAILED DESCRIPTION OF THE DRAWINGS

Identical or identically acting elements are provided with the same reference symbols in the figures.

Figure 1A:
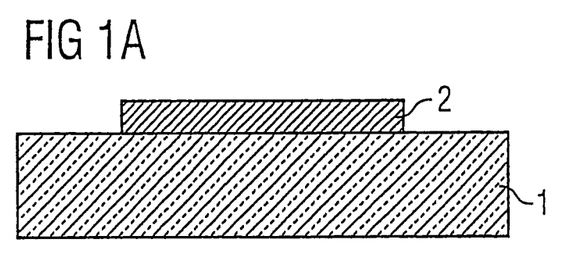
FIGS. 1A to 1E show a schematic illustration of a first exemplary embodiment of a method according to the invention on the basis of five intermediate steps.

In the first step of the method illustrated in FIG. 1, FIG. 1A, a semiconductor layer 2 is applied to a substrate 1. This may be a nitride compound semiconductor layer, for example an InGaN layer, which is grown epitaxially onto a sapphire substrate. More widely, the semiconductor layer 2 may also comprise a plurality of individual layers which may contain, for example, GaN, AlN, AlGaN, InGaN, InN or InAlGaN and be grown successively onto the substrate 1.

Figure 1B:
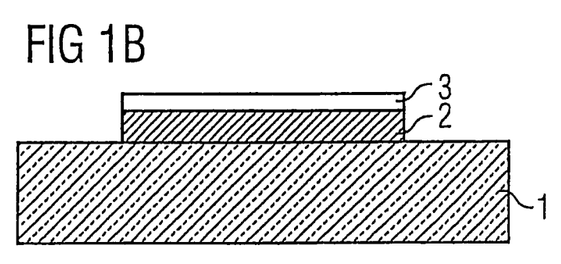

In the next step, FIG. 1B, the semiconductor layer 2 is provided with a contact metallization 3 on the side remote from the substrate. The contact metallization 3 may be vapor-deposited or sputtered on, for example, in the form of a thin gold- and/or platinum-containing layer.

Figure 1C:
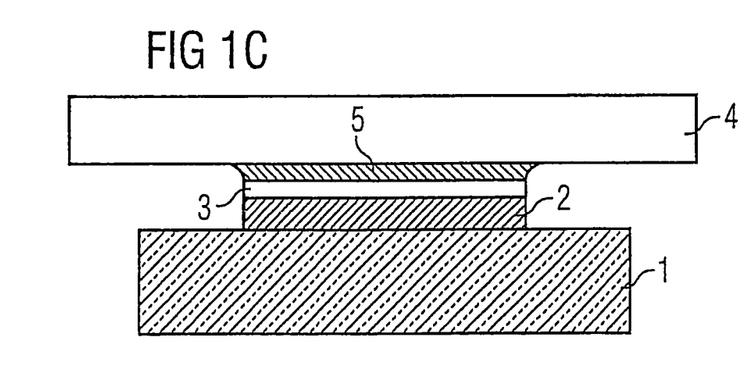

Afterward, a carrier 4 is soldered onto the contact metallization 3, FIG. 1C. The solder 5 used is preferably a gold-containing solder, for example a gold-tin solder with a gold proportion of between 65% by weight and 85% by weight, preferably 75% by weight. Such a soldering connection is distinguished by a high thermal conductivity and a high stability under alternating temperature loads.

The carrier 4 used may be a gallium arsenide wafer, for example, which has a similar coefficient of thermal expansion to that of sapphire.

A carrier 4 in the form of a bonding wafer made of molybdenum is preferably provided. The coefficients of thermal expansion of the bonding wafer $a(Mo)=5.21*10^{-6}\,K^{-1}$ and of the sapphire substrate $a(Al_2O_3)=7.5*10^{-6}\,K^{-1}$ are relatively close together, so that thermally induced stresses in the semiconductor layer 2 are advantageously kept low. What is more, molybdenum is sufficiently tough, so that cracks do not arise in the molybdenum bonding wafer during bonding and during cooling from the bonding temperature to room temperature.

Instead of a gallium arsenide wafer, a germanium wafer may also be used in the case of the invention. The coefficient of thermal expansion of germanium is similar to that of gallium arsenide, so that differences scarcely result in this regard. However, a germanium wafer has the advantage over a gallium arsenide wafer that it can be sawn more easily, in which case, in particular, no arsenic-containing toxic sawing waste is obtained. Furthermore, germanium wafers are mechanically more stable. Thus, a sufficient stability is already achieved with a 200 μm thick germanium wafer for example, whereas the thickness of a corresponding gallium arsenide wafer is greater than 600 μm. It is advantageous that it is also not necessary in this case for the germanium wafer to be thinned by grinding in a further method step. Finally, germanium wafers are generally significantly more cost-effective than gallium arsenide wafers.

Preferably, a gold-containing solder or gold itself is used as solder in conjunction with a germanium wafer. This achieves a particularly fixed connection to the semiconductor layer. Use is made particularly preferably of a gold-vapor-deposited germanium wafer, which may optionally provided with a gold-antimony surface layer.

Figure 1D:
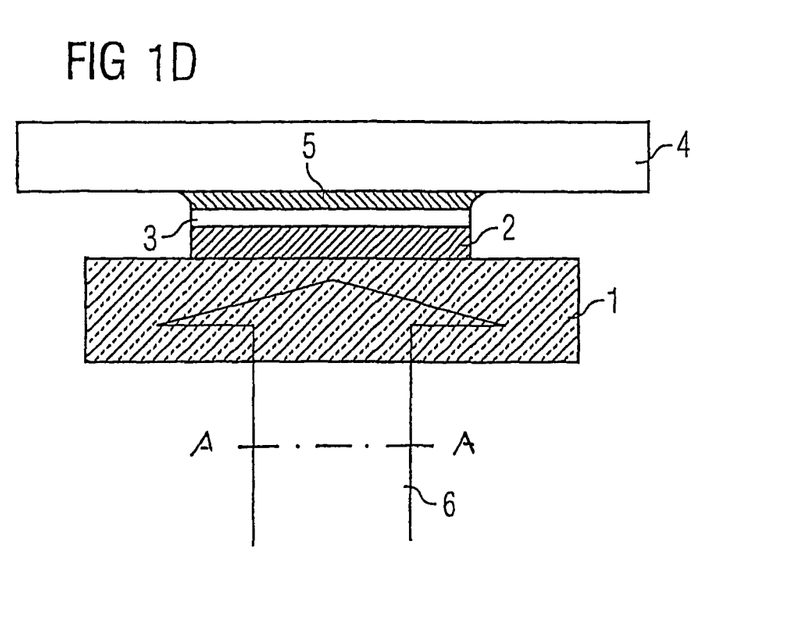

In the subsequent step, FIG. 1D, the semiconductor layer 2 is irradiated through the substrate 1 with laser pulses 6. The radiation energy is predominantly absorbed in the semiconductor layer 2 and brings about a material decomposition at the interface between the semiconductor layer 2 and the substrate 1, so that the substrate 1 can subsequently be lifted off, FIG. 1E. The laser pulses 6 are generated by a Q-switched Nd:YAG laser and frequency-tripled by means of a nonlinear optical element, so that laser pulses 6 having a wavelength of approximately 355 nm are radiated onto the semiconductor layer 2. The pulse duration of the laser pulses is 7 nm or, in one variant, 10 ns. Furthermore, the energy of the laser pulses is dimensioned such that the energy density lies between 100 $mJ/cm^2$ and 1000 $mJ/cm^2$, preferably between 200 $mJ/cm^2$ and 400 $mJ/cm^2$, at the spatial center of the laser pulse.

What is essential in the case of the invention is, on the one hand, that the radiation energy that is radiated in and absorbed near the interface in the semiconductor layer is chosen such that a high temperature that suffices for material decomposition arises locally at the interface between the substrate 1 and the semiconductor layer 2, which temperature falls over the layer thickness of the semiconductor layer to an extent such that the connection 5 between the carrier 4 and the semiconductor layer is not impaired, for example by melting. This is achieved by means of the short pulse duration of the laser pulses of less than or equal to 10 ns.

Figure 2:
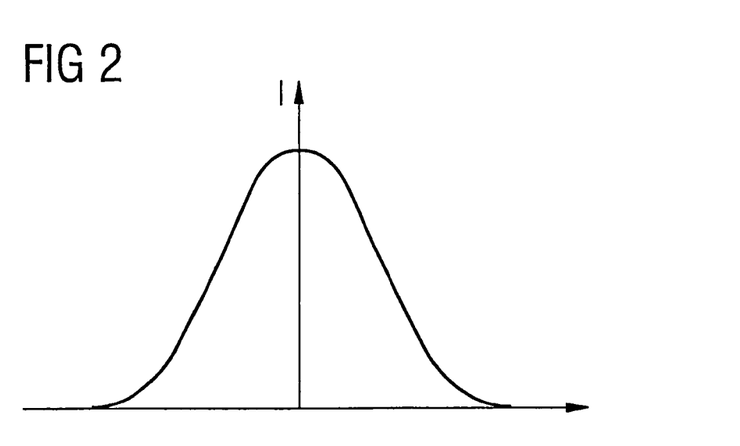
FIG. 2 shows a schematic illustration of a beam profile of the laser pulses in the case of the method shown in FIG. 1, and FIGS. 3A to 3E show a schematic illustration of a second exemplary embodiment of a method according to the invention on the basis of five intermediate steps.

On the other hand, for a given pulse duration and energy, the beam profile is to be adapted such that no cracks arise in the layer to be stripped. The transverse beam profile of the laser pulses is illustrated in FIG. 2. The beam intensity along the line A-A (See FIG. 1D) is plotted. The beam profile is approximately Gaussian. In conjunction with the short pulse duration mentioned, such a beam profile has proved to be advantageous since the lateral flanks do not fall too abruptly and, consequently, a smooth transition arises between the irradiated and the adjacent, non-irradiated region. This reduces the lateral temperature gradient and thus mechanical stresses and cracking in the semiconductor layer.

Generally, in the case of the invention, the flank slope of the beam profile is chosen to be gentle enough to prevent cracks on account of thermally induced mechanical stresses during separation. A suitable flank slope can be determined experimentally, for example, by a procedure in which, given a constant energy density at the center of the laser pulse, the flank slope, for example by means of the diameter of the laser pulse, is varied in steps and an assessment is made in each case on the basis of a sample irradiated therewith to determine whether cracks are avoided during the stripping process as desired. If appropriate, a plurality of experiments have to be carried out and be evaluated statistically.

Figure 3A:
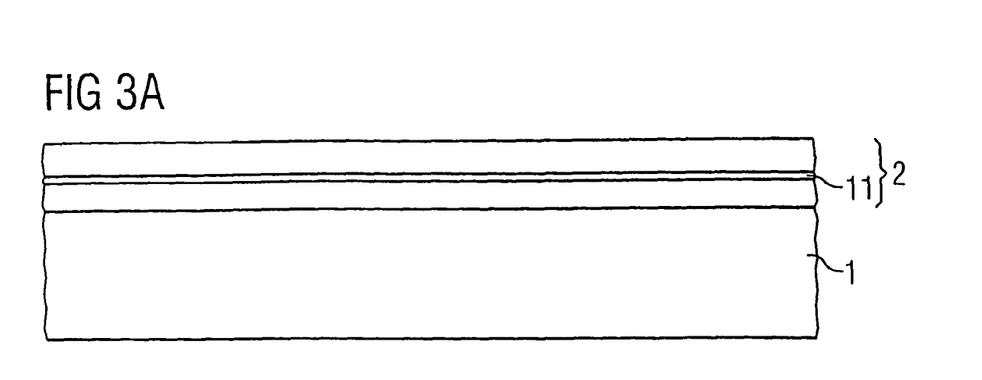

FIG. 3A illustrates a further exemplary embodiment of the invention. As in the case of the exemplary embodiment shown in FIG. 1, firstly a semiconductor layer 2 is applied to a substrate 1. As in the case of the first exemplary embodiment, the semiconductor layer 2 may contain one or more nitride compound semiconductors, comprise a plurality of individual layers and be grown on a sapphire substrate. Said semiconductor layer preferably serves for the generation of radiation and has a corresponding active radiation-generating zone 11.

Figure 3B:
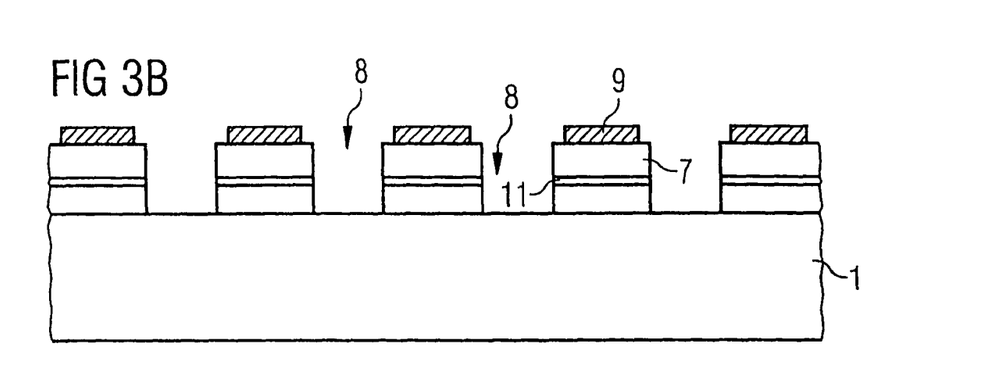

In the next step, FIG. 3B, the semiconductor layer is firstly provided with contact metallization 9 on the top side. In order to produce individual semiconductor bodies 7, the semiconductor layer is subsequently patterned, a plurality of depressions 8 being formed as far as the substrate in the semiconductor layer. Said depressions 8 laterally enclose the semiconductor bodies 7 to be formed. By way of example, such depressions 8 may be etched into the semiconductor layer. This chip patterning has the advantage that, by virtue of the depressions 8, a certain flexibility arises in the lateral direction and it is thus possible to reduce mechanical stresses in the semiconductor layer.

Figure 3C:
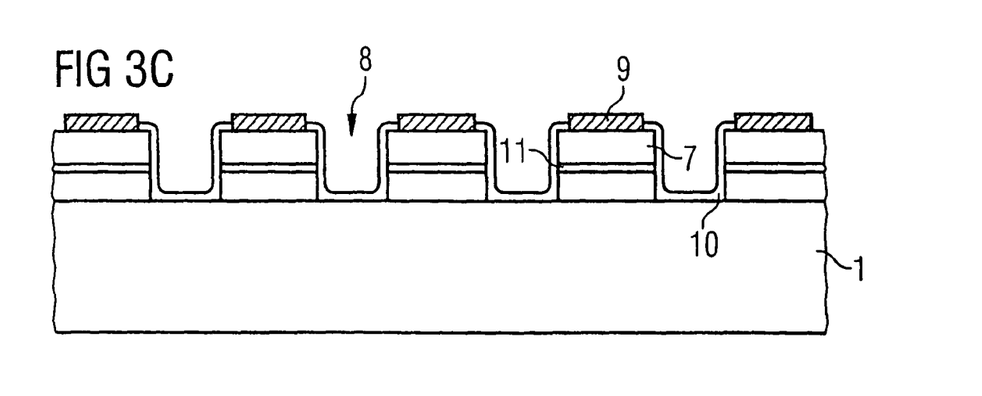

Afterward, a preferably electrically insulating passivation layer 10, for example a silicon nitride layer, for the protection of the semiconductor surfaces is applied to the semiconductor layer 2 or the semiconductor bodies 7. Said passivation layer 10 also covers, in particular, the side areas of the semiconductor bodies 7 that have been uncovered by the depressions 8. This prevents electrically conductive material from reaching the uncovered side areas and short-circuiting the active layer, for example, during subsequent steps. Otherwise, when the carrier is subsequently soldered on, solder could wet the side areas or residues could adhere on the side areas during the later stripping of the substrate, for instance metallic gallium in the case of GaN-based layers, and results in such a short circuit.

In this case, the passivation layer 10 is preferably dimensioned such that the uncovered side areas and substrate regions are covered in layerlike fashion, the complete filling of the depressions being avoided. A covering of the contact metallization (not illustrated) with the passivation layer is removed again.

Figure 3D:
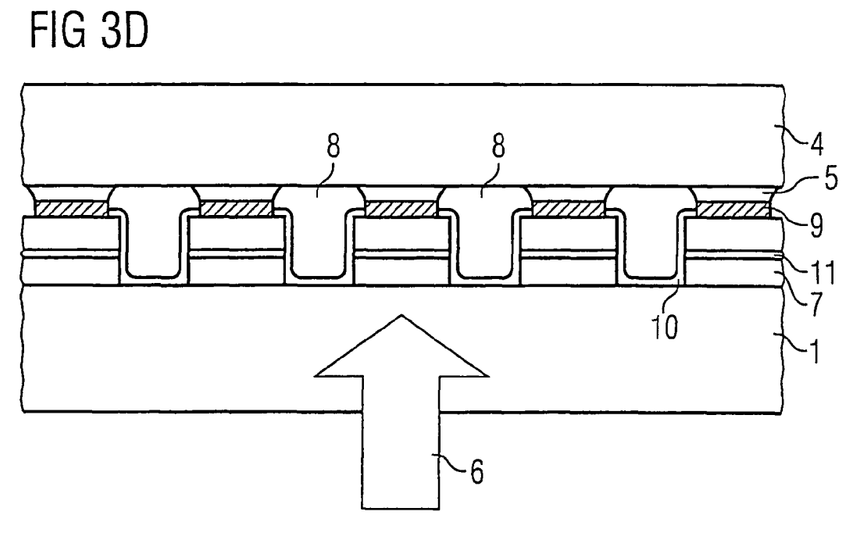

As depicted in FIG. 3D, the semiconductor layer 2 or the semiconductor bodies 7 and the regions 8 situated in between, if appropriate, are irradiated with laser pulses having a pulse duration of less than or equal to 10 ns and a sufficiently gentle flank slope in the beam profile, as in the case of the exemplary embodiment shown in FIG. 1D.

Figure 1E:
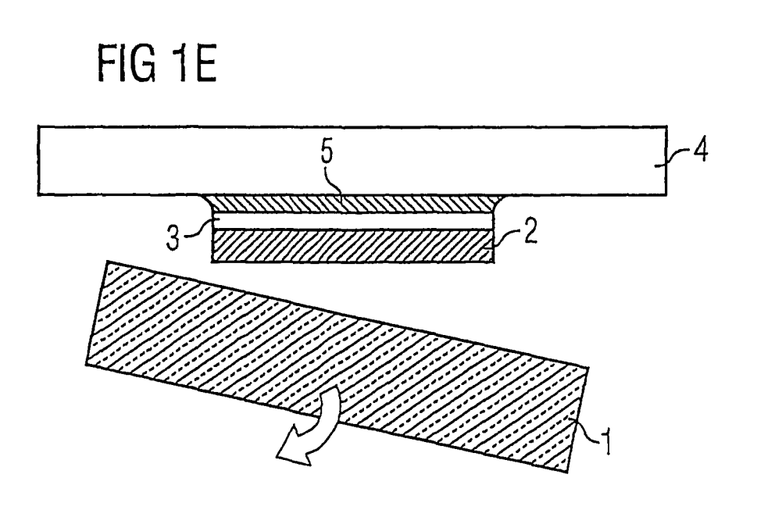
Figure 3E:
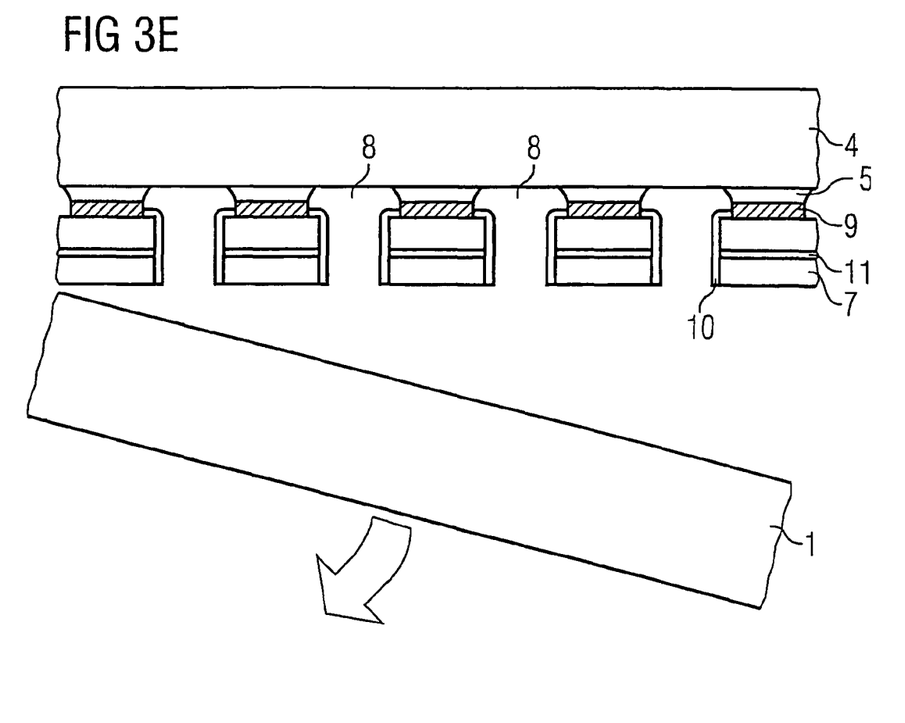

In the final step, FIG. 3E, the substrate is lifted up and removed in the manner already described in connection with FIG. 1E.

It goes without saying that the explanation of the invention on the basis of the exemplary embodiments described does not constitute a restriction thereto. Rather, individual aspects of the exemplary embodiments can be combined with one another largely freely within the scope of the invention. Furthermore, the invention encompasses any new feature and also any combination of features, which, in particular, comprises any combination of features in the patent claims even if this combination is not explicitly specified in the patent claims.

The invention claimed is:
1. A method for producing a semiconductor component, in which a semiconductor layer is separated from a substrate by irradiation with laser pulses, a pulse duration of the laser pulses being less than or equal to 10 ns,
   wherein the laser pulses have a spatial Gaussian beam profile with a flank slope configured to prevent cracks in the semiconductor layer that arise as a result of thermally induced lateral stresses during the separation of the semiconductor layer and the substrate.

* * * * *